(12) United States Patent
Wang

(10) Patent No.: US 7,026,209 B2
(45) Date of Patent: Apr. 11, 2006

(54) DYNAMIC RANDOM ACCESS MEMORY CELL AND FABRICATION THEREOF

(75) Inventor: Ting-Shing Wang, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 104 days.

(21) Appl. No.: 10/605,199

(22) Filed: Sep. 15, 2003

(65) Prior Publication Data

US 2004/0115884 A1  Jun. 17, 2004

Related U.S. Application Data

(63) Continuation-in-part of application No. 10/210,031, filed on Aug. 2, 2002, now Pat. No. 6,875,653.

(51) Int. Cl.
*H01L 21/8242* (2006.01)

(52) U.S. Cl. ....................................... 438/243; 438/246

(58) Field of Classification Search ................. 438/212, 438/268, 241–244, 246–249, 386, 389, 390, 438/392, 700

See application file for complete search history.

(56) References Cited

U.S. PATENT DOCUMENTS 6,777,737 B1 * 8/2004 Mandelman et al. ....... 257/305

* cited by examiner

*Primary Examiner*—David Vu
(74) *Attorney, Agent, or Firm*—Jiang Chyun IP Office

(57) ABSTRACT

A dynamic random access memory (DRAM) cell is described, including a semiconductor pillar on a substrate, a capacitor on a lower portion of a sidewall of the pillar, and a vertical transistor on an upper portion of the sidewall of the pillar. The vertical transistor includes a first doped region, a second doped region, a gate and a gate insulating layer. The first doped region is located in the sidewall and is coupled with the capacitor. The second doped region is located in a top portion of the pillar. The gate is disposed on the sidewall of the pillar between the first and the second doped regions, and the gate insulating layer is disposed between the sidewall and the gate.

17 Claims, 9 Drawing Sheets

DYNAMIC RANDOM ACCESS MEMORY CELL AND FABRICATION THEREOF

CROSS REFERENCE TO RELATED APPLICATIONS

The present application is a continuation-in-part (CIP) application of U.S. patent application Ser. No. 10/210,031 filed Aug. 2, 2002 now U.S. Pat. No. 6,875,653, the entire contents thereof are incorporated herein for reference.

BACKGROUND OF INVENTION

1. Field of the Invention

This invention pertains in general to semiconductor devices, and, more particularly, to memory cells for a dynamic random access memory (DRAM) and processes for manufacturing the same.

2. Description of the Related Art

In the semiconductor industry, DRAM is one of the most important integrated circuits, which motivates continuing research and development. There is a continuing effort to increase the storage capacity, improve the writing and reading speed, and decrease the device dimensions of a DRAM cell. A DRAM cell generally includes a transistor and a capacitor operated by the transistor. Conventionally, the design of a DRAM cell can be divided into three types, namely, planar, stacked-capacitor and trench. In the planar design, the transistor and capacitor of a cell are produced as planar components. In the stacked-capacitor design, the capacitor of a cell is disposed above the transistor. In the trench design, the transistor is disposed on the surface of a substrate, and the capacitor is disposed in a trench formed in the substrate.

The process of forming a trench, however, requires an accurate alignment of mask work. For deep sub-micron semiconductor devices, a deep trench may have a length-to-diameter aspect ratio of 40:1. Typically, capacitors are formed in the deep and narrow trenches by depositing a dielectric layer on the trench walls and filling the trench with a doped polysilicon layer. As the aspect ratio becomes higher, for example, exceeds 20:1, the trench becomes more difficult to fill.

SUMMARY OF INVENTION

In view of the foregoing, on aspect of this invention is to provide a dynamic random access memory (DRAM) cell that has a capacitor formed on the sidewall of a semiconductor pillar to eliminate the trench-filling problem in the prior art and to increase capacitor surface area.

Another aspect of this invention is to provide a DRAM array based on the DRAM cell structure of this invention. The DRAM array can have a higher degree of integration because vertical transistors are formed in the memory cells.

Still, another aspect of this invention is to provide a method for fabricating a DRAM array, so as to eliminate the trench-filling problem in the prior art and increase the integration of DRAM devices.

The DRAM cell of this invention includes a semiconductor pillar formed on a substrate, a capacitor formed on the lower portion of the sidewall of the pillar, and a vertical transistor formed on the upper portion of the sidewall of the pillar. The capacitor includes a first plate in the lower portion of the sidewall of the pillar, a dielectric layer covering the lower portion of the sidewall of the pillar, and a second plate covering the dielectric layer. The vertical transistor includes a first doped region, a second doped region, a gate and a gate insulating layer. The first doped region is located in the sidewall, and is coupled to the second plate of the capacitor. The second doped region is located in the top portion of the pillar. The gate is disposed on the sidewall of the pillar between the first and the second doped regions. The gate insulating layer is disposed between the sidewall of the pillar and the gate.

The DRAM array of this invention includes rows and columns of the aforementioned memory cells of this invention, a plurality of bit lines and a plurality of word lines. The memory cells are disposed on a semiconductor substrate, and have the same structure mentioned above. The second doped regions of the memory cells in one row are coupled to a bit line, and the gates of the memory cells in one column are coupled to a word line.

The method for fabricating a DRAM array of this invention is described as follows. A semiconductor substrate is patterned to form rows and columns of pillars thereon, and then a capacitor is formed on the lower portion of the sidewall of each pillar. The spaces between the pillars are partially filled with a first insulating material to cover the capacitors. A gate structure of a transistor is formed on the sidewall of each pillar above the first insulating layer, including a gate electrode and a gate insulating layer between the pillar and the gate electrode. A first doped region of a transistor is formed in the sidewall of each pillar coupling with the capacitor formed on the same pillar. A second doped region of a transistor is formed in a top portion of each pillar. After the transistor fabrication is completed, the spaces between the pillars are filled with a second insulating material to cover the transistors. A plurality of bit lines is then formed over the substrate, wherein each bit line is electrically connected to the second doped regions of the transistors in one row. In addition, a plurality of word lines is formed over the substrate, wherein each word line is coupled with the gates of the transistors in one column through gate contacts.

Since the capacitor in a DRAM cell of this invention is formed around a semiconductor pillar, but not in a deep trench, the trench-filling problem in the prior art due to the high aspect ratio of deep trenches is thus obviated. Meanwhile, the surface area of the capacitor is quite large because the capacitor can be formed on all sides of the pillar, i.e., all sides of the memory cell.

Moreover, since the transistor of a DRAM cell of this invention is formed with a vertical structure, the lateral area occupied by a memory cell can be significantly reduced to remarkably increase the integration of a DRAM array. In other words, the DRAM array of this invention can have a higher degree of integration.

Furthermore, since a capacitor is formed around a semiconductor pillar in the method for fabricating a DRAM array of this invention, the trench-filling problem in the prior art is precluded. Therefore, the quality of the storage capacitors can be improved.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1–16 illustrate a process flow of fabricating a DRAM array according to a preferred embodiment of this invention, wherein FIGS. 1–6 illustrate the process flow of forming the capacitors of the DRAM array, FIGS. 7–12 illustrate the process flow of forming the vertical transistors of the DRAM array, and FIGS. 13–16 illustrate the subsequent steps including the fabrications of the bit lines and the word lines.

FIGS. 2A–6A illustrate another process flow of forming the capacitors of the DRAM array according to the preferred embodiment of this invention in a cross-sectional view.

FIGS. 7A–10A illustrate another process flow of forming the gate structures of the vertical transistors of the DRAM array according to the preferred embodiment of this invention.

DETAILED DESCRIPTION

Figure 1:
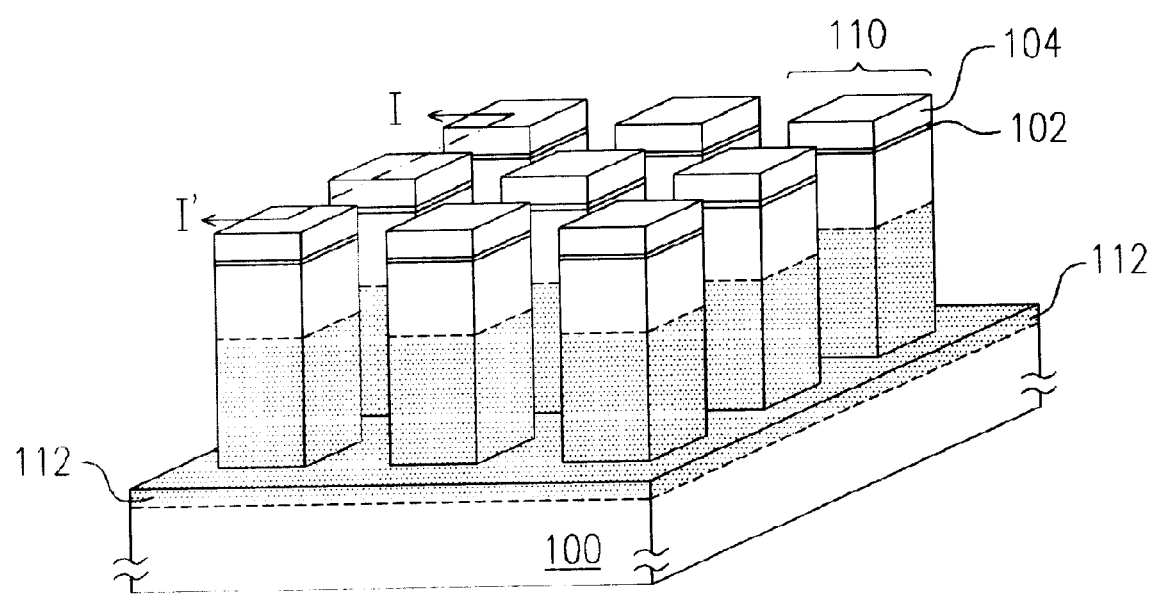
Figure 15:
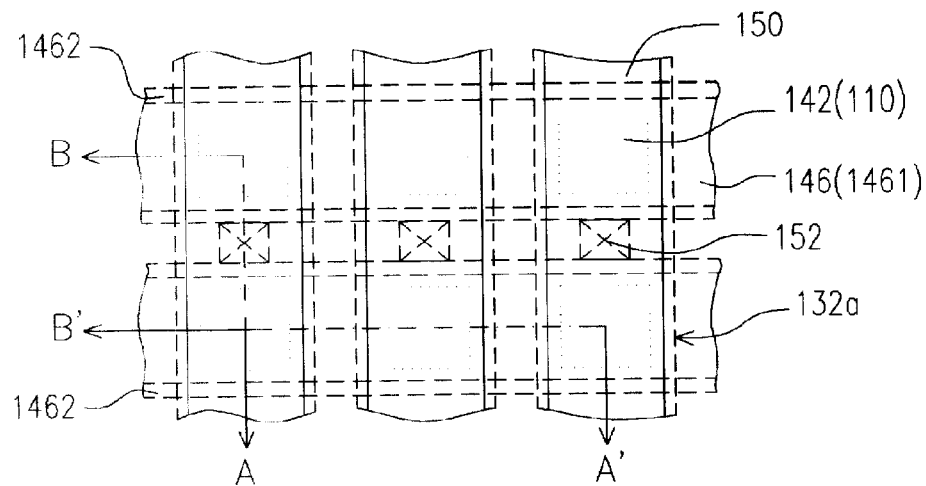
Figure 16:
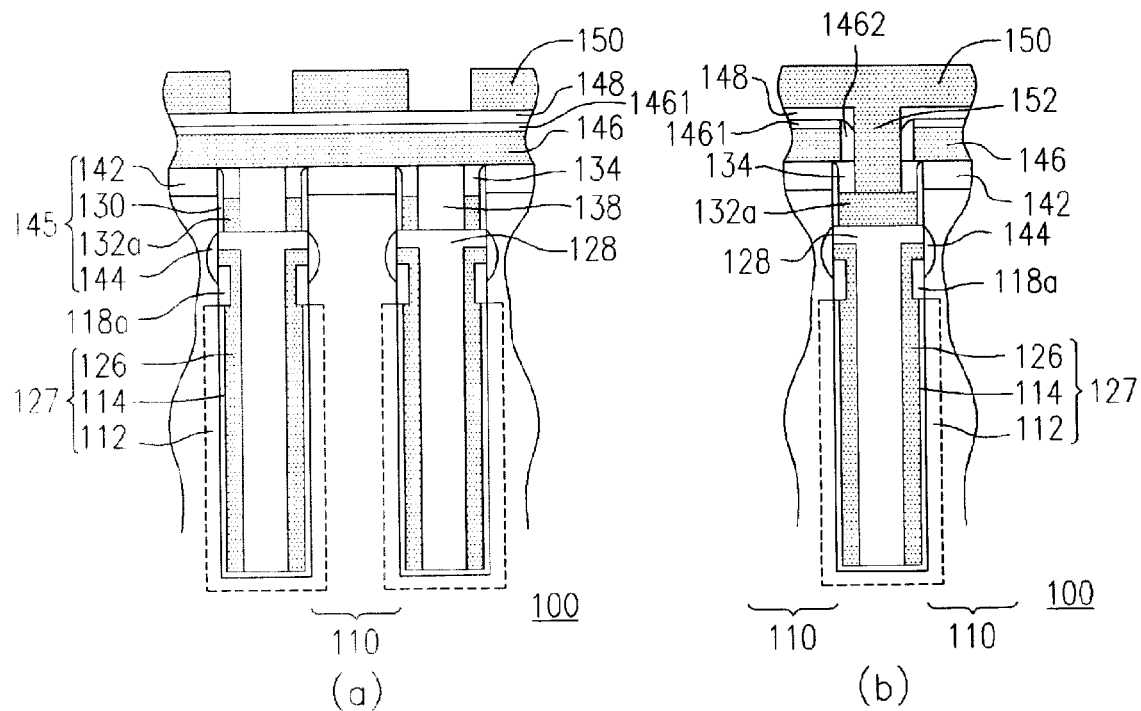

FIGS. 1–16 illustrate a process flow of fabricating a DRAM array according to a preferred embodiment of this invention. FIG. 1 clearly presents the array arrangement in a perspective view, FIGS. 2–9, 11–13 and 16(a) are cross-sectional view along line I—I" in FIG. 1, while FIG. 16(b) is another cross-sectional view and FIGS. 10, 14 and 15 are top views.

More specifically, FIGS. 1–6 illustrate the process flow of forming the capacitors of the DRAM array, FIGS. 7–12 illustrate the process flow of forming the transistors of the DRAM array, and FIGS. 13–16 illustrate the subsequent steps including the fabrications of the bit lines and the word lines.

Fabrication of Capacitors

Referring to FIG. 1, a semiconductor substrate 100, such as a P-doped silicon substrate, is provided, and a pad oxide layer 102 and a patterned mask layer 104 are further formed on the substrate 100. The patterned mask layer 104 includes rows and columns of rectangular (or square) blocks, and is formed with a material such as silicon nitride (SiN). The substrate 100 is then etched using the patterned mask layer 104 as a mask to form rows and columns of semiconductor pillars 110. It is noted that each block of the patterned mask layer 104 may alternatively have a round shape, an elliptical shape or another polygonal shape when viewed from the top, even though the top view of the patterned mask layer 104 as shown in the figure has a rectangular (or square) shape. In the alternative cases, however, a pillar 110 is shaped as a cylinder, an elliptical cylinder, or a corresponding polygonal pillar.

Moreover, it is particularly noted that a semiconductor pillar 110 and the portion of the mask layer 104 thereon together are sometimes referred to as a pillar 110 in the descriptions of the specification hereinafter for convenience.

Referring to FIG. 1 again, a common electrode 112 of the subsequently formed storage capacitors is formed in the lower portion of the sidewall of each pillar 110 and in the surface layer of the substrate 100 with a doping method. The doping method includes the following steps, for example. An arsenic-doped silicon oxide layer (not shown) is formed between the pillars 110, having a predetermined depth. The arsenic-doped silicon oxide layer can be formed by, for example, depositing silicon oxide with in-situ arsenic doping over the substrate 100 to fill the spaces between the pillars 110 and etching back the arsenic-doped silicon oxide layer until its depth is increased to the predetermined one. Alternately, the arsenic-doped silicon oxide layer can be formed covering the lower portion of pillar sidewall through photoresist coating and etching back process to define the predetermined depth. After the arsenic-doped silicon oxide layer is covered with an undoped silicon oxide layer, a thermal process is performed to thermally driving some arsenic atoms from the arsenic-doped silicon oxide layer into the contacting surface layers of the semiconductor pillars 110 and the surface layer of the bottom substrate 100.

The subsequent steps for completing the fabrication of the capacitors are illustrated in FIGS. 2–6, wherein FIGS. 2–6 are cross-sectional views along the cutting line I—I" in FIG. 1.

Figure 2:
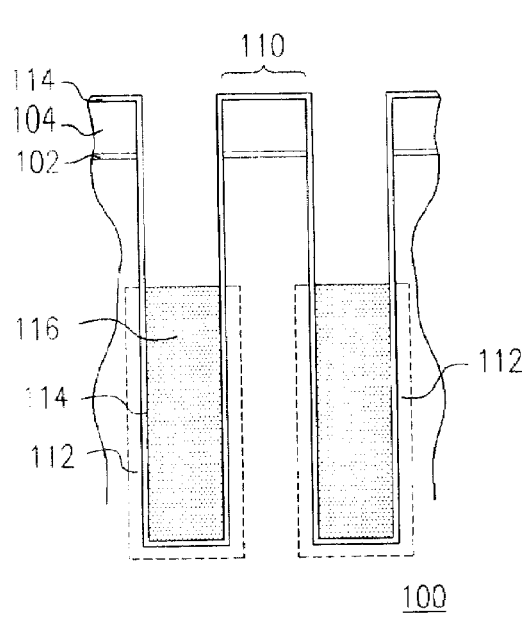

Referring to FIG. 2, a conformal dielectric layer 114 is formed on the substrate 100 and the pillars 110. The conformal dielectric layer 114 is preferably an oxide/nitride/oxide (ONO) or nitride/oxide (NO) composite layer as a capacitor dielectric layer. A conductive layer 116 is then formed between the pillars 110 with a top depth approximately the same as (or lower than) that of the common electrode 112. The conductive layer 116 is formed with a material such as N$^+$-doped polysilicon, and can be formed by, for example, depositing polysilicon with in-situ doping over the substrate 100 to fill the spaces between the pillars 110 and etching back the doped polysilicon to a predetermined depth.

Figure 3:
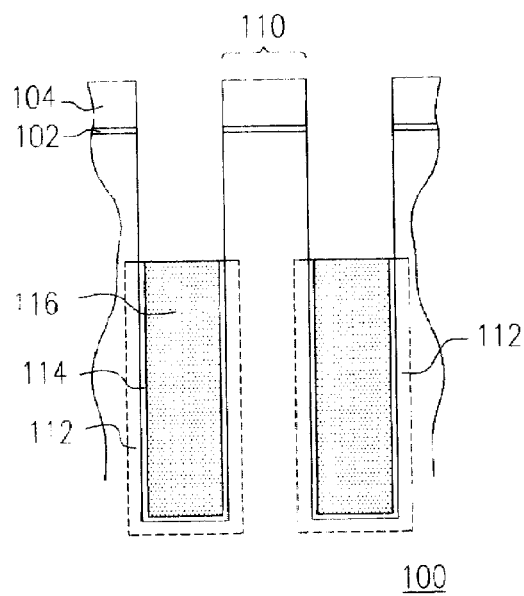

Referring to FIG. 3, the dielectric layer 114 exposed by the conductive layer 116 is removed. The method for removing the exposed dielectric layer 114 may include a wet etching process. When the dielectric layer 114 is an ONO composite layer comprising a top oxide layer, a nitride layer and a bottom oxide layer, for example, dilute hydrofluoric acid, phosphoric acid and dilute hydrofluoric acid can be used in sequence to remove the exposed top oxide layer, the exposed nitride layer and the exposed bottom oxide layer, respectively.

Figure 4:
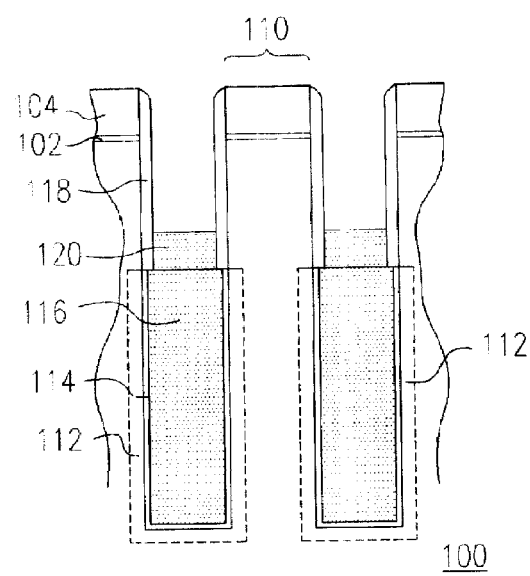

Referring to FIG. 4, an insulating spacer 118 is formed on the sidewall of each pillar 110 above the conductive layer 116. The insulating spacer 118 is composed of a material such as silicon oxide, and is formed with chemical vapor deposition (CVD) and subsequent anisotropic etching, for example. It is noted that although the insulating spacer 118 is shown to form on two sides of the corresponding pillar 110 in the cross-sectional view, it actually surrounds the pillar 110. A conductive layer 120 is then formed between the pillars overlying the conductive layer 116 and covering a lower portion of each insulating spacer 118. The conductive layer 120 is composed of a material such as N$^+$-doped polysilicon, and can be formed by, for example, depositing polysilicon over the substrate 100 with in-situ doping and then etching back the doped polysilicon to the predetermined depth.

Figure 5:
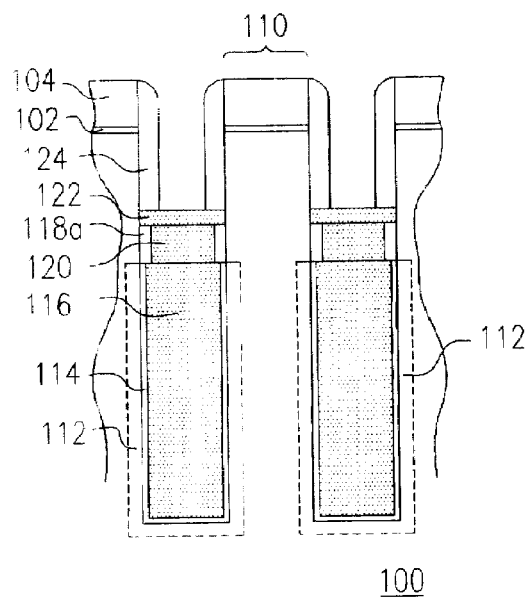

Referring to FIG. 5, the insulating spacer 118 on each pillar 110 exposed by the conductive layer 120 is removed to form a collar insulating layer 118a surrounding the pillar 110. Another conductive layer 122 is formed between the pillars 110 overlying the collar insulating layer 118a and the conductive layer 120. The conductive layer 122 is formed with a material such as N$^+$-doped polysilicon, and can be formed by, for example, depositing polysilicon over the substrate 100 with in-situ doping and then etching back the doped polysilicon to the predetermined depth. Thereafter, a mask spacer 124 is formed on the sidewall of each pillar above the conductive layer 122, having a thickness larger than that of the collar insulating layer 118a. The mask spacer 124 is for defining an upper electrode of a capacitor, as described below.

Figures 6, 6A:
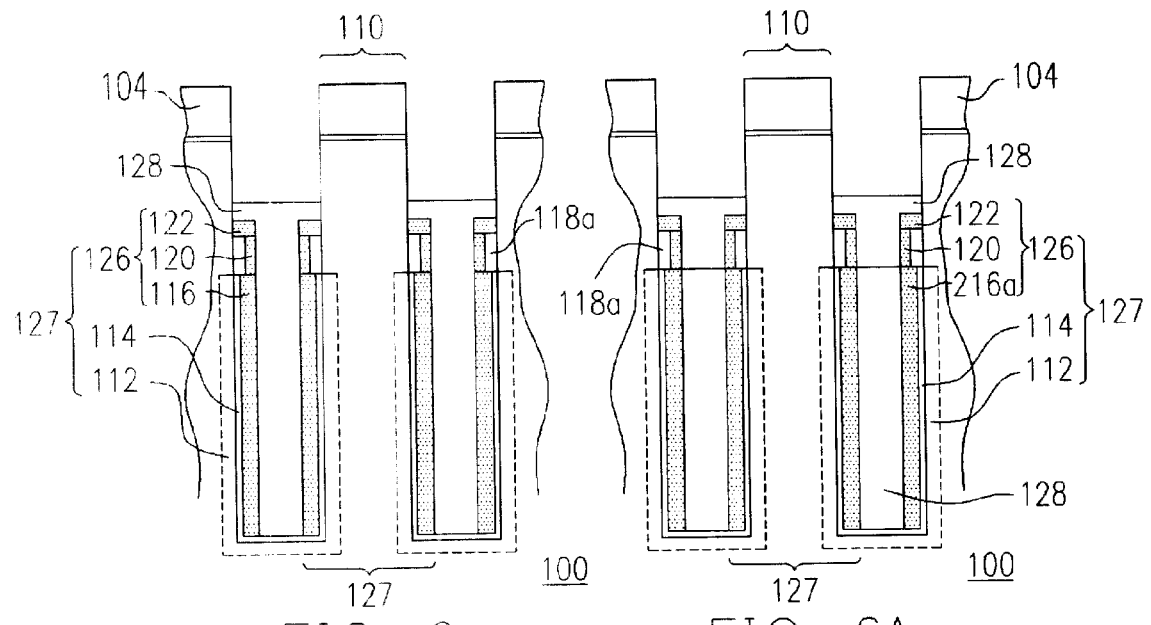

Referring to FIGS. 5 and 6 simultaneously, the three conductive layers 122, 120 and 116 are sequentially etched using the mask spacers 124 as a mask to form an upper electrode 126 on the lower sidewall of each pillar 110. It is noted that the remaining conductive layer 122, i.e., the top portion of the upper electrode 126, directly contacts with the sidewall of the semiconductor pillar 110. The upper electrode 126, the dielectric layer 114 and the common electrode 112 together constitute a capacitor 127. Thereafter, the mask spacers 124 are removed, and an insulating layer 128 is filled between the pillars 110 to cover all capacitors 127. The insulating layer 128 is formed with a material such as silicon oxide, and can be formed by, for example, depositing silicon oxide over the substrate 100 and then etching back the silicon oxide to the predetermined depth.

The capacitor 127 may also be formed with other methods. For example, FIGS. 2A–6A illustrate another process flow of forming the capacitors of the DRAM array in a cross-sectional view.

Figure 2A:
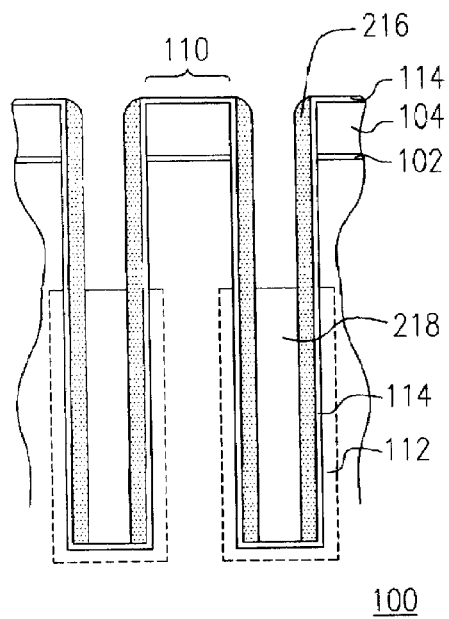

Referring to FIG. 2A, after the pillars 110 are defined and the common electrode 112 is formed, a conformal dielectric layer 114 is formed over the substrate 100. A conductive spacer 216 is then formed on the sidewall of each pillar 110. An insulating layer 218 is formed between the pillars 110 with a top depth approximately the same as (or lower than) that of the common electrode 112. The insulating layer 218 is composed of a material such as silicon oxide, and can be formed by, for example, depositing silicon oxide over the substrate 100 and then etching back the silicon oxide to the predetermined depth.

Figure 3A:
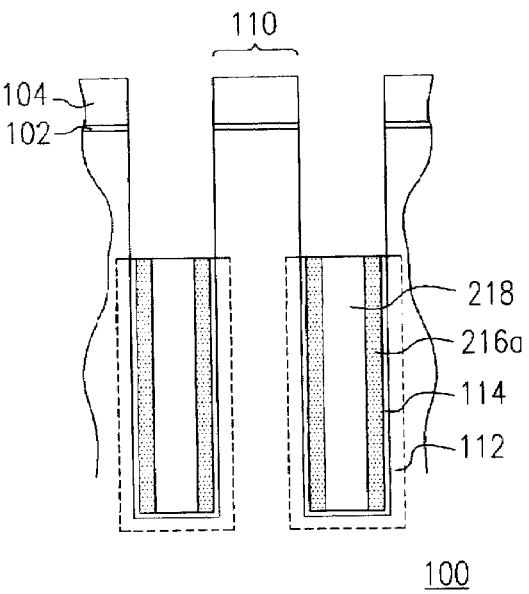

Referring to FIG. 3A, the conductive spacer 216 and the conformal dielectric layer 114 exposed by the insulating layer 218 are removed. The remaining conductive spacer 216a is a first part of the upper electrode that will be completed later.

Figure 4A:
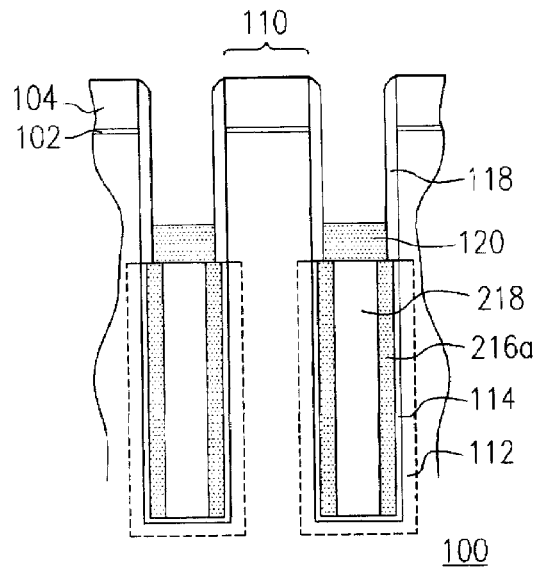

Referring to FIG. 4A, an insulating spacer 118 is formed on the sidewall of each pillar 110 above the insulating layer 218. A conductive layer 120 is then formed between the pillars 110 overlying the conductive layer 216a and the insulating layer 218 and covering a lower portion of the insulating spacer 118.

Figure 5A:
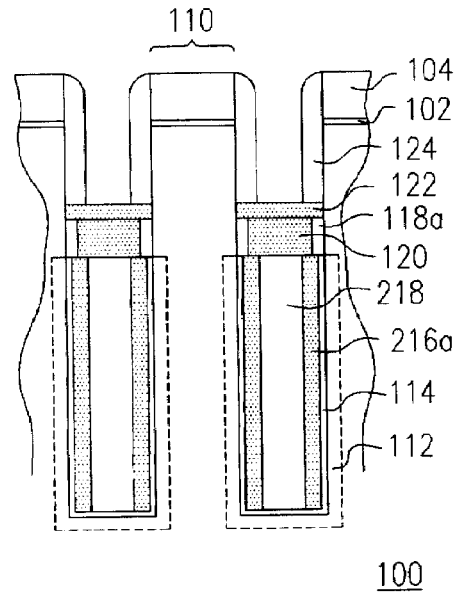

Referring to FIG. 5A, the insulating spacer 118 on each pillar 110 exposed by the conductive layer 120 is removed to form a collar insulating layer 118a surrounding the pillar 110. Another conductive layer 122 is formed between the pillars 110 overlying the collar insulating layer 118a and the conductive layer 120. Thereafter, a mask spacer 124 is formed on the sidewall of each pillar 110 above the conductive layer 122, having a thickness larger than that of the collar insulating layer 118a. The mask spacer 124 is for defining an upper electrode of a capacitor, as described below.

Referring to FIGS. 5A and 6A simultaneously, the two conductive layers 122 and 120 are sequentially etched using the mask spacers 124 as a mask. The remaining conductive layers 122 and 120 and the conductive spacer 216a formed previously together form an upper electrode 126, wherein the conductive layer 122, i.e., the top portion of the upper electrode 126, directly contacts with the sidewall of the semiconductor pillar 110. The upper electrode 126, the dielectric layer 114 and the common electrode 112 together form a capacitor 127. Thereafter, the mask spacers 124 are removed, and an insulating layer 128 is filled between the pillars 110 covering the remaining conductive layers 122 and 120 and the insulating layer 218.

Moreover, in the two methods for forming a capacitor around each pillar, some modifications or variations on, for example, the material and the fabrication method of each layer and the fabrication sequence of the layers, are also possible within the scope of this invention.

Fabrication of Transistors

Fabrication of Gate Structures

Figures 7, 7A:
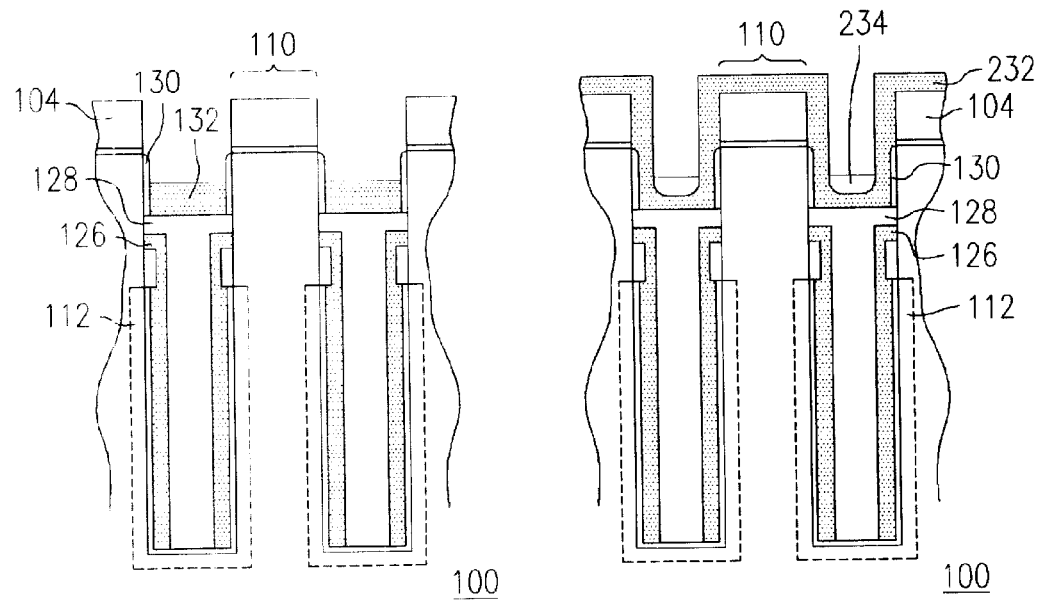

Referring to FIG. 7, after the insulating layer 128 is formed to isolate the upper electrode 126, a gate insulating layer 130 is formed on the exposed sidewall of each semiconductor pillar 110. The gate insulating layer 130 is, for example, a thin silicon oxide layer or a thin oxide/nitride layer, and may be formed with a thermal oxidation process or a thermal oxidation-nitridation process. A conductive layer 132 is then formed between the pillars 110 overlying the insulating layer 128 and covering the lower portion of the gate insulating layer 130. The conductive layer 132 is composed of a material such as $N^+$-doped polysilicon, and can be formed by, for example, depositing polysilicon over the substrate 100 with in-situ doping and etching back the doped polysilicon to the predetermined depth.

Figure 8:
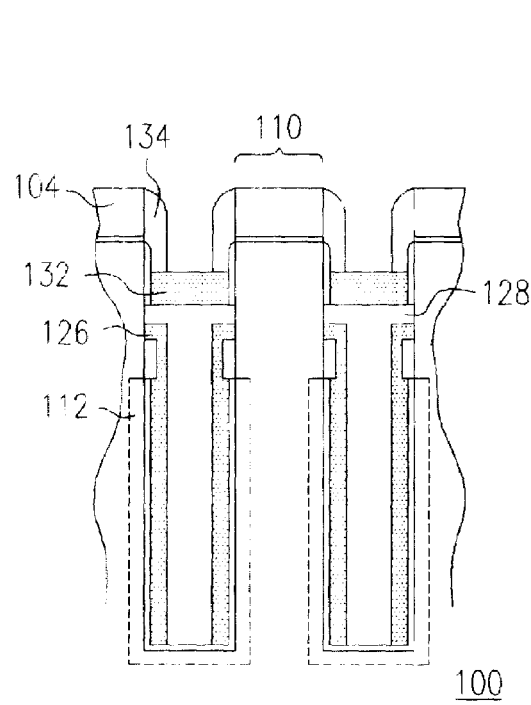

Referring to FIG. 8, a mask spacer 134 is formed on the sidewall of each pillar 110 above the conductive layer 132. The mask spacer 134 is for defining a gate later, and is formed with an insulating material such as silicon oxide.

Figure 9:
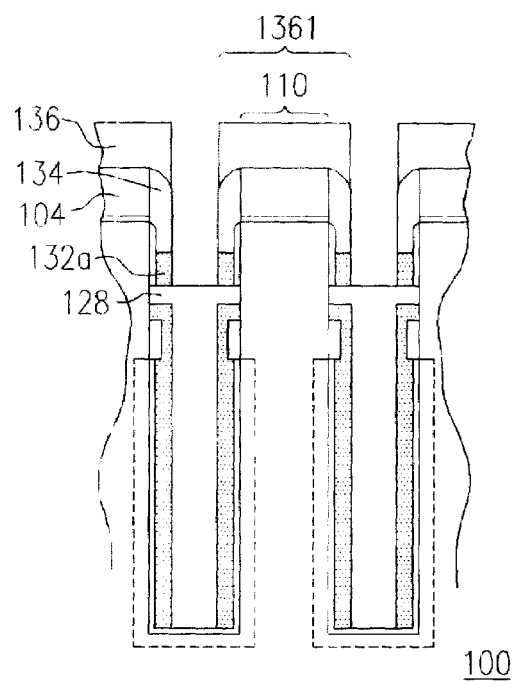
Figure 10:
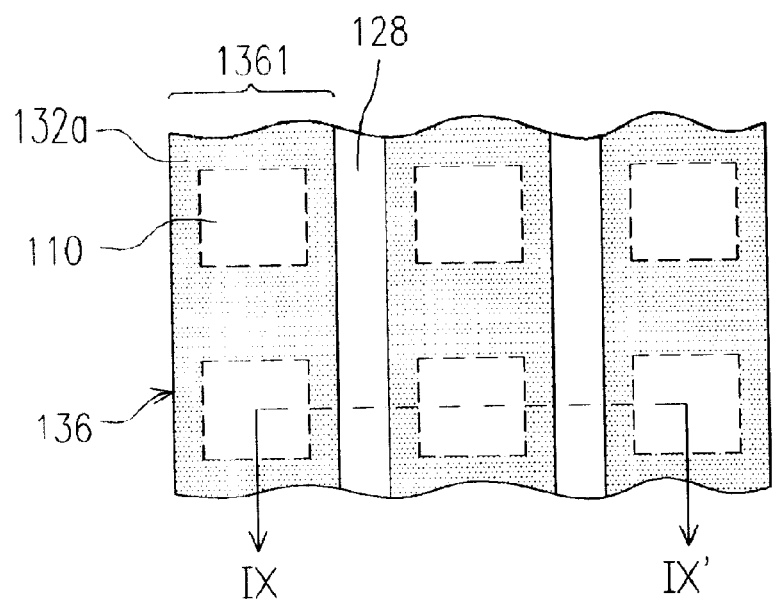

Refer to FIGS. 9–10, wherein FIG. 10 is a top view of the resulting structure after the following steps, and FIG. 9 is a cross-sectional view of the resulting structure in FIG. 10 along line IX–IX'. A patterned mask layer 136, such as a patterned photoresist layer, is formed over the substrate 100. The patterned mask layer 136 includes parallel linear patterns 1361, wherein each linear pattern 1361 covers the pillars 110 in one column and the conductive layer 132 between the pillars of the same column. The conductive layer 132 is then etched using the mask spacers 134 and the patterned mask layer 136 as a mask to form a gate 132a on the sidewall of each pillar 110. A mask spacer 134 ensures the corresponding gate 132a to surround the corresponding pillar 110 even if misalignments of the patterned mask layer 136 has occurred. The gates 132a on the sidewalls of the pillars 110 in one column are connected via the remaining conductive layer 132a between the pillars 110 of the same column to be a gate line 132a (dotted region), which can directly serve as a word line. However, another low-resistance conductive line can be further formed overlying and electrically connecting with the gate line 132a to reduce the resistance, as described later.

The gate structure that includes the gate insulating layer 130 and the gate 132a may also be formed with other methods. For example, FIGS. 7A–10A illustrate another process flow of forming the gate structures of the vertical transistors of the DRAM array.

Referring to FIG. 7A, after the insulating layer 128 is formed to isolate the upper electrode 126, a conformal conductive layer 232, such as a conformal $N^+$-doped polysilicon layer, is formed over the substrate 100. A mask layer 234 is then form between the pillars 110 to cover the bottom portion of the conductive layer 232 on the insulating layer 128, the mask layer 234 having a thickness sufficient to resist the anisotropic etching plasma for defining the gate lines, as described later. The mask layer 234 is formed with a material such as silicon oxide, and can be formed by, for example, depositing silicon oxide on the conductive layer 232 to fill the spaces between the pillars 110 and then etching back the silicon oxide to the predetermined depth.

Figure 8A:
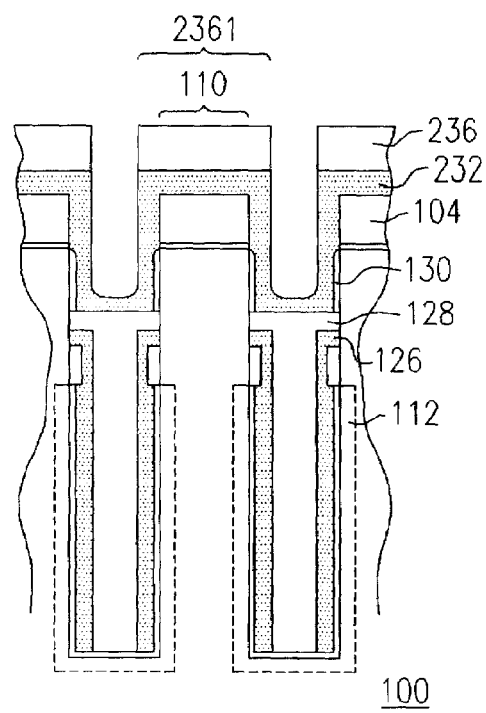
Figure 10A:
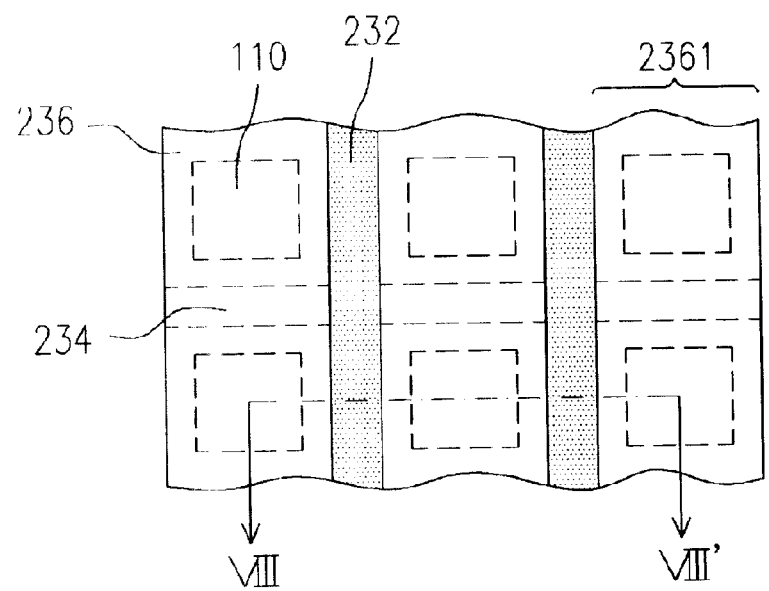

Referring to FIGS. 8A and 10A, wherein FIG. 10A is a top view of the resulting structure after the following steps, and FIG. 8A is a cross-sectional view of the resulting structure in FIG. 10A along line VIII–VIII". A patterned mask layer 236 is formed over the substrate 100, including parallel linear patterns 2361, wherein each linear pattern 2361 covers the conductive layer 232 on the tops of the pillars 110 in one column and the conductive layer 232 and the mask layer 234 between the pillars 110 of the same column. The mask layer 234 exposed by the patterned mask layer 236 is then removed to expose a portion of the conductive layer 232 between every two columns of pillars 110.

Figure 9A:
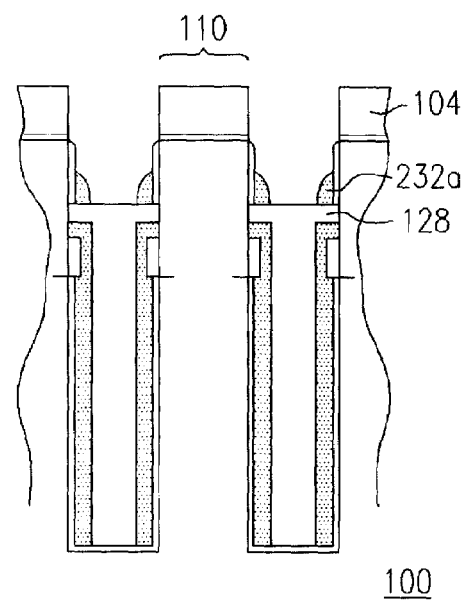

Referring to FIG. 9A as well as FIGS. 8A and 10A, the mask layer 236 is removed to expose the remaining mask layer 234 between the pillars 110 in each column and the conductive layer 232 not covered by the remaining mask layer 234. The conductive layer 232 is then anisotropically etched using the mask layer 234 as a mask to remove the portions of the conductive layer 232 on tops of the mask layer 104 and those between every two columns of pillars 100 first. The conductive layer 232 between the pillars 110 of the same column is not etched because of the protection of the mask layer 234. The anisotropic etching process is continued until the height of the conductive layer 232 on the sidewalls of the pillars 100 is reduced to a predetermined level. The remaining spacer-like conductive layer 232 on the sidewall of each pillar 110 serves as a gate 232a. The gates 232a on the sidewalls of the pillars 100 in one column are connected via the conductive layer 232 between the pillars 110 of the same column, which is protected by the mask layer 234 in the anisotropic etching process, to be a gate line 232a. The gate line 232a can directly serve as a word line. However, another low-resistance conductive line can be further formed overlying and electrically connecting with the gate line to reduce the resistance.

Moreover, in the two methods for forming a gate structure around each pillar, some modifications or variations on, for example, the material and the fabrication method of each layer and the fabrication sequence of the layers, are also possible within the scope of this invention.

Fabrication of Source/Drain

Figure 11:
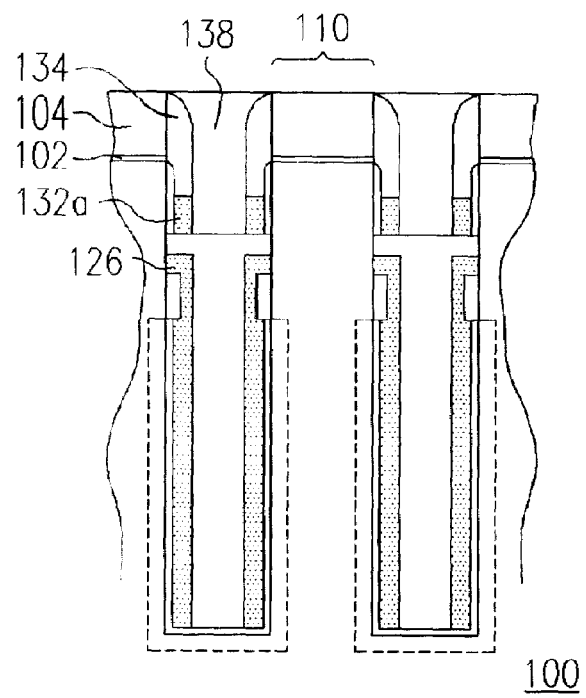

Referring to FIG. 11, the spaces between the pillars 110 are filled up with an insulating layer 138, which is formed with a material such as silicon oxide and is formed by, for example, performing a plasma-enhanced chemical vapor deposition (PECVD) process and a chemical mechanical polishing (CMP) process in sequence.

Figure 12:
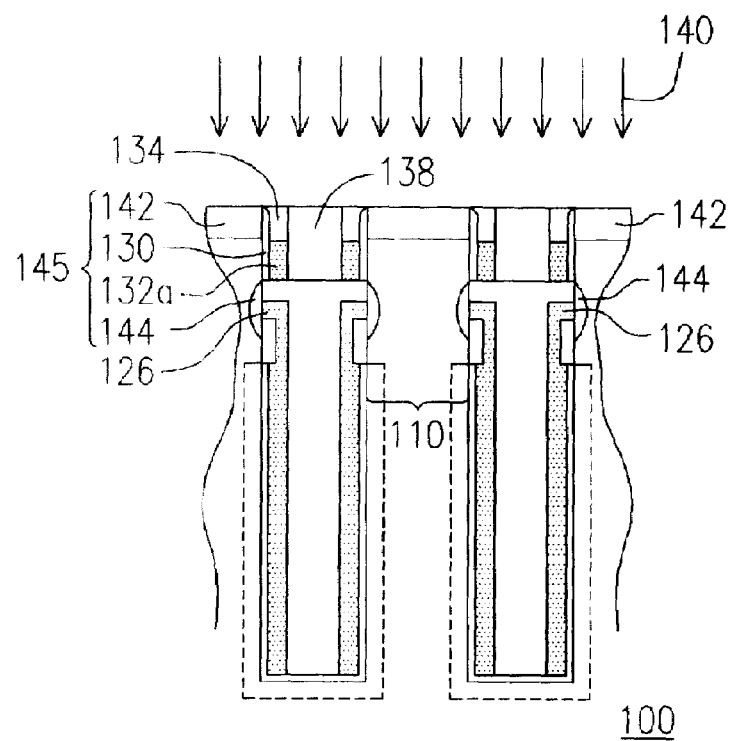

Referring to FIG. 12, the patterned mask layer 104, the pad oxide layer 102, a portion of the mask spacers 134 and a portion of the insulating layer 138 are removed. The four parts may be removed by performing a chemical mechanical polishing (CMP) process, for example, so that the top surfaces of the mask spacers 134 and the insulating layer 138 are substantially coplanar with those of the semiconductor pillars 110. An ion implantation 140 is then conducted to form a doped region 142 in the top portion of each semiconductor pillar 110 to serve as a source/drain region. The doped region 142 may be an N$^+$-doped region implanted with phosphorous ions or arsenic ions. A high-temperature annealing process is then performed to repair the damaged lattices in the semiconductor pillars 110 caused by the ion implantation 140, and to drive some dopants from the upper electrode 126 into the sidewall of each semiconductor pillar 110 to form a doped region 144. The doped regions 142 and 144, the gate 132a and the gate insulating layer 130 together form a vertical transistor 145. It is noted that although the doped region 144 is not illustrated in previous figures, the doped region 144 actually grows more or less during every thermal process after the top portion 122 (FIG. 6) of the upper electrode 126 is formed. However, in the preferred embodiment, the doped region 144 grows mainly during the high-temperature annealing process after the doped regions 142 are formed.

Fabrication of Bit Lines and Word Lines

Figure 13:
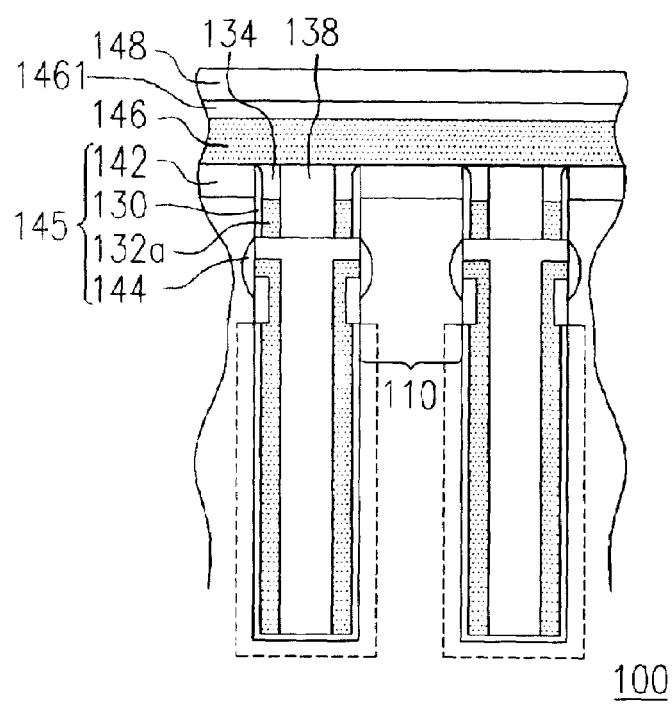
Figure 14:
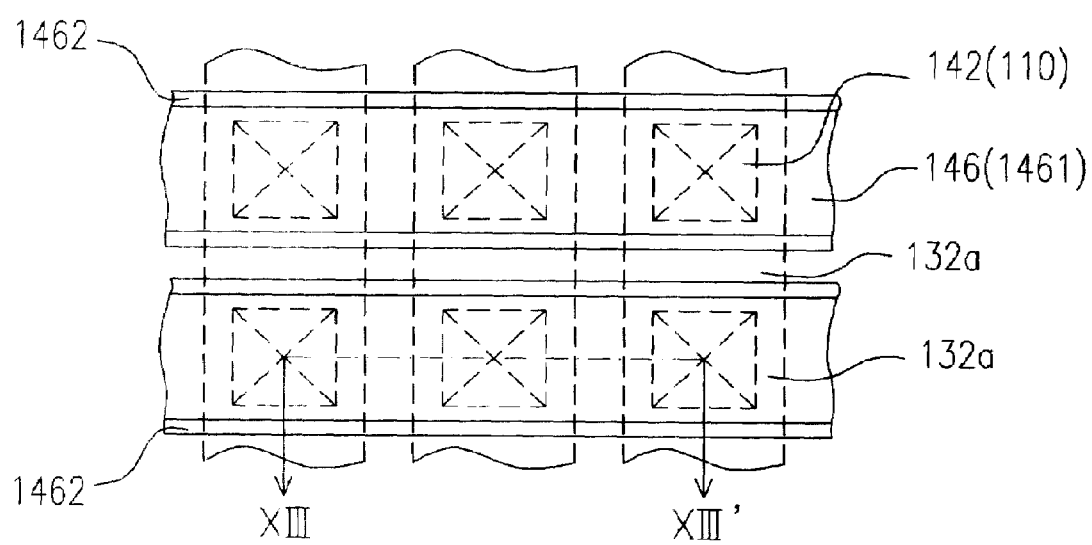

FIGS. 13–14 illustrate the step of forming the bit lines of the memory array, wherein FIG. 14 is a top view of the resulting structure after the following steps, and FIG. 13 is a cross-sectional view of the resulting structure in FIG. 14 along line XIII–XIII". After the fabrication of the vertical transistor 145 is completed, bit lines 146 are formed over the substrate 100, wherein each bit line 146 directly contacts with the doped regions 142 in the top portions of the pillars 110 in one row. The bit lines 146 are formed with a material such as N$^+$-doped polysilicon, and can be formed by using a deposition-patterning method or a damascene method. In addition, a cap layer 1461 can be disposed on each bit line 146, and a protective spacer 1462 can be formed on the sidewalls of each pair of bit line 146 and cap layer 1461 if the bit lines 146 and the cap layers 1461 are formed with a deposition-patterning procedure. The cap layers 1461 and the protective spacers 1462, which are preferably constituted of silicon nitride, are formed to prevent the bit lines 146 from being exposed during the subsequent contact hole etching process, so that the contact holes will be formed in a self-aligned manner. Thereafter, an insulating layer 148 is formed over the substrate 100 covering the bit lines 146 and filling up the gap between every two bit lines 146 to isolate the bit lines 146 from the word lines that will be formed in the next step.

FIGS. 15–16(a)/(b) illustrate the step of forming additional word lines of the memory array to electrically connect with the gate lines formed previously. FIG. 15 is a top view of the resulting structure after the following steps, and FIGS. 16(a) and 16(b) are cross-sectional views of the resulting structure in FIG. 15 along line A–A" and line B–B", respectively. After the insulating layer 148 is formed, word lines 150 are formed over the substrate 100, wherein each word line 150 is electrically connected to the gates 132a on the sidewalls of the pillars 110 in one column via at least one contact 152. The contact 152 directly contacts with the conductive layer 132a connecting between two gates 132a on the sidewalls of two adjacent pillars 110 in the same column. The contact 152 and the word line 150 are formed by, for example, forming a contact hole in the insulating layer 148 exposing a portion of the conductive layer 132a, depositing a conductive layer covering the insulating layer 148 and filling up the contact hole, and then patterning the conductive layer. Alternatively, the contact 152 and the word line 150 can be formed with a damascene process.

Referring to FIGS. 15 and 16(a)/(b), since the capacitor 127 in a DRAM cell of this invention is formed around a semiconductor pillar 110, but not in a deep trench, the trench-filling problem in the prior art caused by high aspect ratios of deep trenches does not exist. Meanwhile, the surface area of the capacitor 127 is quite large since the capacitor 127 is formed on four sides of the pillar 110.

Moreover, since the transistor 145 of a DRAM cell of this invention is formed with a vertical structure, the size of each memory cell can be significantly reduced to remarkably increase the integration of the memory array.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a DRAM array, comprising:
   patterning a semiconductor substrate to form rows and columns of pillars thereon;
   forming a capacitor on a lower portion of a sidewall of each pillar;
   partially filling spaces between the pillars with a first insulating material to cover the capacitors;
   forming a gate structure of a transistor on the sidewall of each pillar above the first insulating layer, wherein a method for forming the gate structure comprises steps of:
   forming a gate insulating layer on the sidewall of each pillar above the first insulating material;
   forming a conductive layer between the pillars and on the first insulating material, the conductive layer having a top surface lower than the top surface of the pillar;
   forming a mask spacer an the sidewall of each pillar above the conductive layer;
   forming a mask layer comprising a plurality of linear patterns over the substrate, wherein each linear pattern runs over the pillars in one column; and
   etching the conductive layer using the mask spacer and the mask layer as a mask to form a gate electrode on the sidewall of each pillar, wherein the gate electrodes on the pillars in one column are connected via the conductive layer between the pillars of the same column to form a gate line;
   forming a first doped region of a transistor in the sidewall of each pillar coupling with the capacitor on the sidewall of the same pillar;
   forming a second doped region of a transistor in a top portion of each pillar;
   filling the spaces between the pillars with a second insulating material to cover the transistors;
   forming a plurality of bit lines over the substrate, wherein each bit line is electrically connected to the second doped regions of the transistors in one row; and
   forming a plurality of word lines over the substrate, wherein each word line is coupled with the gates of the transistors in one column.

2. The method of claim 1, wherein forming the capacitor on the lower portion of the sidewall of each pillar comprises:
   doping a surface layer of the substrate and the lower portions of the sidewalls of the pillars to form a common electrode;
   forming a dielectric layer surrounding the lower portion of the sidewall of each pillar; and
   forming an upper electrode covering the dielectric layer for coupling with a corresponding first doped region.

3. The method of claim 2, wherein a top of the upper electrode is higher than a top of the dielectric layer, and forming the capacitor on the lower portion of the sidewall of each pillar further comprises:
   forming a collar insulating layer on the sidewall of the pillar above the dielectric layer before the upper electrode is farmed, so that the collar insulating layer surrounds the pillar and is covered by an upper portion of the upper electrode.

4. The method of claim 3, wherein the upper electrode comprises a doped semiconductor material, and a top portion of the upper electrode above the collar insulating layer directly contacts with the pillar, so that the first doped region is fanned via dopant diffusion from the top portion of the upper electrode to the sidewall of the pillar during thermal processes alter the upper electrode is formed.

5. The method of claim 4, wherein forming the dielectric layer, the upper electrode and the collar insulating layer comprises:
   forming a conformal dielectric layer on the substrate and the pillars;
   forming a first conductive layer between the pillars to cover a lower portion of the conformal dielectric layer;
   removing the dielectric layer exposed by the first conductive layer;
   forming an insulating spacer on the sidewall of each pillar above the first conductive layer;
   forming a second conductive layer between the pillars to cover lower portions of the insulating spacers;
   removing a portion of each insulating spacer exposed by the second conductive layer to form a collar insulating layer on each pillar;
   forming a third conductive layer between the pillars and on the collar insulating layers and the second conductive layer;
   forming a mask spacer on the sidewall of each pillar above the third conductive layer; and
   sequentially etching the third conductive layer, the second conductive layer and the first conductive layer using the mask spacer as a mask to form an upper electrode for each pillar.

6. The method of claim 4, wherein forming the dielectric layer, the upper electrode and the collar insulating layer comprises:
   forming a conformal dielectric layer on the substrate and the pillars;
   forming a conductive spacer on the sidewall of each pillar covering a portion of the conformal dielectric layer;
   forming an insulating layer between the pillars to cover lower portions of the conductive spacers;
   removing portions of the conductive spacers and the dielectric layer exposed by the insulating layer;
   forming an insulating spacer on the sidewall of each pillar above the insulating layer, the insulating spacer exposing a portion of a top surface of a corresponding conductive spacer;
   forming a second conductive layer between the pillars to cover lower portions of the insulating spacers;
   removing a portion of each insulating spacer exposed by the second conductive layer to form a collar insulating layer on the sidewall of each pillar;
   forming a third conductive layer between the pillars and on the collar insulating layers and the second conductive layer;
   forming a mask spacer on the sidewall of each pillar above the third conductive layer; and
   sequentially etching the third conductive layer and the second conductive layer using the mask spacer as a mask to form an upper electrode for each pillar, wherein the upper electrode includes a conductive spacer, a portion of the second conductive layer and a portion of the third conductive layer.

7. The method of claim 1, wherein a gate line directly serves as a word line for the transistors in one column.

8. The method of claim 1, wherein a word line is formed crossing over the bit lines to electrically connect a corresponding gate line via at least one contact between the pillars of the corresponding column.

9. The method of claim 1, wherein forming the gate structure of the transistor on the sidewall of each pillar above the first insulating layer comprises:
   forming a gate insulating layer on the sidewall of each pillar above the first insulating material;

forming a conformal conductive layer on the pillars and the first insulating material, also covering the gate insulating layer;
forming a first mask layer between the pillars to cover a lower portion of the conformal conductive layer;
forming a second mask layer comprising a plurality of linear patterns on the conformal conductive layer and the first mask layer, wherein each linear pattern runs over the pillars in one column;
removing portions of the first mask layer exposed by the second mask layer;
removing the second mask layer; and
anisotropically etching the conformal conductive layer using the remaining first mask layer as a mask until a top of the conductive layer is substantially lower than the top surface of the pillar, so as to form a spacer-like gate electrode on the sidewall of each pillar, wherein the gate electrodes on the pillars in one column are connected via the conductive layer between the pillars of the same column to form a gate line.

10. The method of claim 9, wherein the gate line directly serves as a word line for the transistors in one column.

11. The method of claim 9, wherein a word line is formed crossing over the bit lines to electrically connect the corresponding gate line via at least one contact between the pillars of the corresponding column.

12. The method of claim 1, wherein each bit line directly contacts with the second doped regions of to transistors in one row.

13. The method of claim 1, wherein the gate electrodes on the pillars of one column are connected via the conductive layer between the pillars of the same column to form the gate line, and the step of forming the word lines comprises:
forming a dielectric layer over the substrate covering the bit lines; and
forming at least one contact through the dielectric layer and a word line on the dielectric layer to electrically connect with the gate line, wherein the contact directly contacts the conductive layer between two pillars of the same column.

14. The method of claim 13, wherein
each bit line is formed with a cap layer thereon; and the method further comprises:
forming a protective spacer on sidewalls of each pair of bit line and cap layer before the dielectric layer is formed.

15. The method of claim 13, wherein the contact and the word line are formed with a damascene process.

16. A method for fabricating a DRAM array, comprising:
patterning a semiconductor substrate to form rows and columns of pillars thereon;
forming a capacitor on a lower portion of a sidewall of each pillar, wherein a method for forming the capacitor comprises steps of:
doping a surface layer of the substrate and the lower portions of the sidewalls of the pillars to form a common electrode;
forming a conformal dielectric layer on the substrate and the pillars;
forming a first conductive layer between the pillars to cover a lower portion of the conformal dielectric layer;
removing the dielectric layer exposed by the first conductive layer;
forming an insulating spacer on the sidewall of each pillar above the first conductive layer;
forming a second conductive layer between the pillars to cover lower, portions of the insulating spacers;
removing a portion of each insulating spacer exposed by the second conductive layer to form a collar insulating layer on each pillar;
forming a third conductive layer between the pillars and on the collar insulating layers and the second conductive layer;
forming a mask spacer on the sidewall of each pillar above the third conductive layer; and
sequentially etching the third conductive layer, the second conductive layer and the first conductive layer using the mask spacer as a mask to form an upper electrode for each pillar;
partially filling spaces between the pillars with a first insulating material to cover the capacitors;
forming a gate structure of a transistor on the sidewall of each pillar above the first insulating layer, the gate structure comprising a gate electrode and a gate insulating layer between the pillar and the gate electrode;
forming a first doped region of a transistor in die sidewall of each pillar coupling with the capacitor on the sidewall of the same pillar;
forming a second doped region of a transistor in a top portion of each pillar;
filling the spaces between the pillars with a second insulating material to cover the transistors;
forming a plurality of bit lines over the substrate, wherein each bit line is electrically connected to the second doped regions of the transistors in one row; and
forming a plurality of word lines over the substrate, wherein each word line is coupled with the gates of the transistors in one column.

17. A method for fabricating a DRAM array, comprising:
patterning a semiconductor substrate to form rows and columns of pillars thereon;
forming a capacitor on a lower portion of a sidewall of each pillar, wherein a method for forming the capacitor comprises steps of:
doping a surface layer of the substrate and the lower portions of the sidewalls of the pillars to form a common electrode;
forming a conformal dielectric layer on the substrate and the pillars;
forming a conductive spacer on the sidewall of each pillar covering a portion of the conformal dielectric layer;
forming an insulating layer between the pillars to cover lower portions of the conductive spacers;
removing portions of the conductive spacers and the dielectric layer exposed by the insulating layer;
forming an insulating spacer on the sidewall of each pillar above the insulating layer, the insulating spacer exposing a portion of a top surface of a corresponding conductive spacer;
forming a second conductive layer between the pillars to cover lower portions of the insulating spacers;
removing a portion of each insulating spacer exposed by the second conductive layer to form a collar insulating layer on the sidewall of each pillar;
forming a third conductive layer between the pillars and on the collar insulating layers and the second conductive layer;
forming a mask spacer on the sidewall of each pillar above the third conductive layer; and
sequentially etching the third conductive layer and the second conductive layer using the mask spacer as a mask to form an upper electrode for each pillar, wherein the upper electrode includes a conductive spacer, a portion of the second conductive layer and a portion of the third conductive layer;

partially filling spaces between the pillars with a first insulating material to cover the capacitors;

forming a gate structure of a transistor on the sidewall of each pillar above the first insulating layer, the gate structure comprising a gate electrode and a gate insulating layer between the pillar and the gate electrode;

forming a first doped region of a transistor in the sidewall of each pillar coupling with the capacitor on the sidewall of the same pillar;

forming a second doped region of a transistor in a top portion of each pillar;

filling the spaces between the pillars with a second insulating material to cover the transistors;

forming a plurality of bit lines over the substrate, wherein each bit line is electrically connected to the second doped regions of the transistors in one row; and forming a plurality of word lines over the substrate, wherein each word line is coupled with the gates of the transistors in one column.

* * * * *